United States Patent [19]

Laupman

[11] 4,126,829

[45] Nov. 21, 1978

[54] ELECTRONIC ECHO APPARATUS

[75] Inventor: Robert R. Laupman, Wijchen, Netherlands

[73] Assignee: Novanex Automation N.V., Wijchen, Netherlands

[21] Appl. No.: 810,104

[22] Filed: Jun. 27, 1977

[30] Foreign Application Priority Data

Jun. 30, 1976 [NL] Netherlands ........................ 7607182

[51] Int. Cl.[2] ................................................ H03F 1/36

[52] U.S. Cl. ..................................... 330/110; 84/1.24; 84/DIG. 10; 84/DIG. 26

[58] Field of Search ......................... 330/86, 110, 282; 84/1.24, DIG. 10, DIG. 26; 333/29; 179/1 J

[56] References Cited

U.S. PATENT DOCUMENTS

| | | | |
|---|---|---|---|
| 3,277,381 | 10/1966 | Sullivan | 333/29 X |
| 4,005,268 | 1/1977 | Canell et al. | 84/DIG. 26 X |

*Primary Examiner*—James B. Mullins

[57] ABSTRACT

An electronic echo apparatus comprising an input amplifier, an output amplifier connected thereto through a transmission channel, a delay device connected in parallel to said channel, and a feedback path connected in parallel to said delay device, characterized in that said feedback path includes a control means, and in that there is connected to the output of the output amplifier a means for measuring the output signal of said output amplifier, comparing said output signal to a predetermined threshold value and, when said output signal reaches said threshold value, supplying a control signal to said control means for terminating the feedback.

1 Claim, 1 Drawing Figure

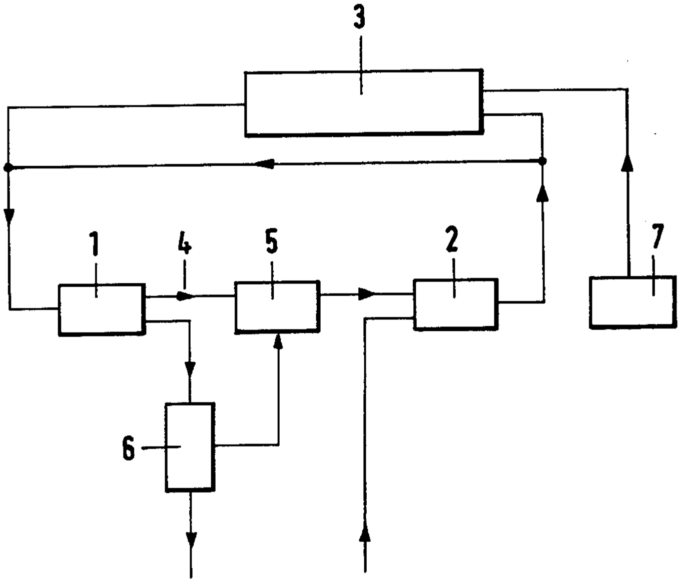
3
1
4
5
2
7
6

ELECTRONIC ECHO APPARATUS

This invention relates to an electronic echo apparatus comprising an input amplifier, an output amplifier connected thereto through a transmission channel, a delay device connected in parallel to this channel, and a feedback path connected in parallel to the delay device.

For economic reasons, it is desirable to keep the delay line short and hence inexpensive. In that case, in order to obtain the total delay required, use should be made of a high clock frequency, the use of such a short delay line requiring a large number of circulations of the signals to produce the total delay time of, for example, 2 seconds.

It has been found that when such a large number of circulations is used it is difficult to ensure that, after termination of the input signal, there is no further build-up of the signal along the delay device and the feedback path. The higher the clock frequency and the larger the number of circulations, the more difficult it becomes to exactly determine the point where circulations should be discontinued, partly as a result of the variations in reproducibility of the integrated circuits used in such a device.

It is an object of the present invention to provide a solution to this problem.

According to the present invention, there is provided an electronic echo apparatus comprising an input amplifier, an output amplifier connected thereto through a transmission channel, a delay device connected in parallel to said channel, and a feedback path connected in parallel to said delay device, characterized in that said feedback path includes a control means, and in that there is connected to the output of the output amplifier a means for measuring the output signal of said output amplifier, comparing said output signal to a predetermined threshold value and, when said output signal reaches said threshold value, supplying a control signal to said control means for terminating the feedback.

One embodiment of the invention will now be described, by way of example, with reference to the accompanying drawing showing a block diagram of this embodiment.

In the drawing, an input amplifier 2 has its output connected to the input of a delay device 3. This delay device may be a tape recorder and reproducer, a helical delay line, or an analog electronic delay line with a bucket memory, or a digital system.

The output of this delay line 3 is connected to the input of an output amplifier 1 having two outputs. One of these outputs is connected across a feedback path 4 to a second input of input amplifier 2. The second output of the output amplifier leads to the output of the apparatus.

A clock serving for delay line 3 is indicated at 7.

During operation of the apparatus as described so far, part of the output signal from output amplifier 1 can be applied via feedback path 4 to input amplifier 2 for it to be passed again through delay line 3, whereby a repetition effect is produced. With such an arrangement, the signal can be circulated a number of times with decreasing amplitude to produce an echo-reverberation effect.

If now, for the economic reasons mentioned above, a short delay line is chosen and, in order to obtain the total required delay time, a high frequency of clock 7, which means that the signal from output amplifier 1 is circulated a large number of times, it may occur, partly in view of the fact that the reproducibility of the integrated circuits used in the apparatus varies rather greatly, that after termination of the input signal there is still circulation, and hence the output signal is decreased incorrectly.

According to the present invention, this can be prevented in a simple manner by virtue of the following features.

As shown in the drawing, according to the present invention a control means 5 is included in feedback path 4. Furthermore, included in the output conductor leading from output amplifier 1 to the output of the apparatus is a means 6 which measures the output signal from this amplifier, and compares it to a predetermined threshold value for this signal.

An output of means 6 is connected to an input of control means 5.

If now, during operation, an input signal is supplied to input amplifier 2, which in connection with the selected high clock-frequency is circulated a large number of times, a build-up of the output signal from output amplifier 1 is effected as a result of this repetition effect. Under the conditions outlined above it may occur that this build-up proceeds too far.

To limit this, the output signal from the output amplifier is compared to a reference value which corresponds to this limit. When the output signal from the output amplifier being built up reaches this threshold value a control signal is generated in means 6, which control signal is supplied to the relevant input of control means 5 through the connection referred to. The supply of this control signal causes the feedback through feedback path 4 to be blocked, so that further circulation of the output signal from output amplifier 1, and hence further build-up of this output signal is discontinued.

The effect of these features is that when a weak input signal is supplied to the apparatus a certain echo will occur and also a certain echo length is obtained. When a signal of large amplitude is supplied to the apparatus, this signal issues once from the output amplifier as a large-amplitude signal, but the reverberation accompanying this strong signal is decreased substantially in the same way as that of the weak signal.

In summary it could be stated that each signal is in essence issued in an uncontrolled manner, but is fed back in a controlled manner by means of the apparatus according to the invention.

It has been found that with such a construction the unnatural effect that occurs when the primary input signal of the apparatus is controlled in a similar manner, is eliminated. All this does not exclude, however, that a control as described herein can be used in combination with a control of the input signal as described in U.S. patent application Ser. No. 725,145, filed Sept. 20, 1976, now U.S. Pat. No. 4,099,135.

I claim:

1. An electronic echo apparatus comprising an input amplifier, an output amplifier, a transmission channel connecting said input amplifier to said output amplifier, a delay device connected in parallel to said channel, and a feedback path connected between said input amplifier and said output amplifier, said feedback path including a control means, and means connected to the output of said output amplifier, for measuring the output signal of said output amplifier, comparing said output signal to a predetermined threshold value and, when said output signal reaches said threshold value, supplying a control signal to said control means for terminating the feedback.

* * * * *